US012772636B2

(12) United States Patent
Chung et al.

(10) Patent No.: US 12,772,636 B2
(45) Date of Patent: Oct. 20, 2026

(54) ELECTRONIC DEVICE AND MANUFACTURING METHOD OF ELECTRONIC DEVICE

(71) Applicant: AUO Corporation, Hsinchu (TW)

(72) Inventors: Cheng-Han Chung, Hsinchu (TW); Han-Chung Lai, Hsinchu (TW); Yu-Cheng Chang, Hsinchu (TW); Po Han Lin, Hsinchu (TW); Hsin Hao Chen, Hsinchu (TW); Yao-An Mo, Hsinchu (TW); Chun-Ming Chao, Hsinchu (TW)

(73) Assignee: AUO Corporation, Hsinchu (TW)

( * ) Notice: Subject to any disclaimer, the term of this patent is extended or adjusted under 35 U.S.C. 154(b) by 502 days.

(21) Appl. No.: 18/459,445

(22) Filed: Sep. 1, 2023

(65) Prior Publication Data

US 2024/0322098 A1 Sep. 26, 2024

(30) Foreign Application Priority Data

Mar. 22, 2023 (TW) ................................ 112110628

(51) Int. Cl.

| | |
|---|---|
| ***H10H 20/85*** | (2025.01) |
| ***H10H 20/857*** | (2025.01) |
| ***H10W 90/00*** | (2026.01) |
| *H10H 20/01* | (2025.01) |

(52) U.S. Cl.

CPC .......... *H10H 20/857* (2025.01); *H10W 90/00* (2026.01); *H10H 20/0364* (2025.01)

(58) Field of Classification Search

CPC ... H10H 20/857; H10W 90/00; H10W 90/291

USPC ................................................ 313/498–512

See application file for complete search history.

(56) References Cited

U.S. PATENT DOCUMENTS

| | | | | |
|---|---|---|---|---|
| 2016/0190105 | A1* | 6/2016 | Rhee | H10W 90/00 257/76 |
| 2019/0348588 | A1* | 11/2019 | Hsieh | H10H 20/857 |
| 2023/0026864 | A1* | 1/2023 | Ho | H10W 76/60 |
| 2023/0073010 | A1* | 3/2023 | Zhai | H10H 20/018 |
| 2023/0317497 | A1 | 10/2023 | Chen et al. | |
| 2025/0048808 | A1* | 2/2025 | Huang | H10H 20/855 |

FOREIGN PATENT DOCUMENTS

| | | |
|---|---|---|
| CN | 109326685 | 2/2019 |
| CN | 114008786 | 2/2022 |
| CN | 115719750 | 2/2023 |

* cited by examiner

*Primary Examiner* — Christopher M Raabe

(74) *Attorney, Agent, or Firm* — JCIPRNET

(57) ABSTRACT

An electronic device includes a temporary storage base, an adhesive layer, light-emitting elements, and a sealant. The adhesive layer is disposed on the temporary storage base. The light-emitting elements are disposed on the adhesive layer. The sealant is disposed on the temporary storage base and surrounds the adhesive layer. In addition, other electronic devices and a manufacturing method of the electronic device are also provided.

14 Claims, 14 Drawing Sheets

ELECTRONIC DEVICE AND MANUFACTURING METHOD OF ELECTRONIC DEVICE

CROSS-REFERENCE TO RELATED APPLICATION

This application claims the priority benefit of Taiwan application serial no. 112110628, filed on Mar. 22, 2023. The entirety of the above-mentioned patent application is hereby incorporated by reference herein and made a part of this specification.

BACKGROUND

Technical Field

The disclosure relates to an electronic device and a manufacturing method of the electronic device.

Description of Related Art

A light-emitting diode display panel includes a driving back board and a plurality of light-emitting diode elements transposed on the driving backboard. Inheriting the characteristics of light-emitting diodes, the light-emitting diode display panel has the advantages of power saving, high efficiency, high brightness, and fast response time. In addition, compared with an organic light-emitting diode display panel, the light-emitting diode display panel also has advantages such as easy color adjustment, long luminous life, and no image burn-in. Therefore, the light-emitting diode display panel is regarded as the display technology of the next generation.

Generally speaking, in a manufacturing process of the light-emitting diode display panel, a plurality of light-emitting diodes on a temporary storage base have to be transferred to a driving back board, and the plurality of light-emitting diodes are respectively bonded with a plurality of pad sets of the driving back board. However, in the above process, due to the influence of gravity, the middle area of the temporary storage base board sags, causing some of the light-emitting diodes to fail to bond with the corresponding pad set smoothly, resulting in a decrease in the bonding yield. In addition, in the above process, the evenness of the stage used to carry the driving back board also affects the yield of bonding the light-emitting diode with the pad set.

SUMMARY

The disclosure provides a manufacturing method of an electronic device, which can improve the bonding yield.

An embodiment of the disclosure provides an electronic device with a high yield.

Another embodiment of the disclosure provides another electronic device with a high yield.

The manufacturing method of the electronic device of the disclosure includes the following. A driving back board and a light-emitting element array base are provided, in which the driving back board includes a plurality of pad sets, and the light-emitting element array base includes a temporary storage base, an adhesive layer disposed on the temporary storage base, and a plurality of light-emitting elements disposed on the adhesive layer. A sealant is formed on one of the driving back board and the light-emitting element array base. The light-emitting element array base and the driving back board are aligned and pressed together in a near-vacuum environment, so that the plurality of light-emitting elements are aligned with the plurality of pad sets, and the light-emitting element array base is connected with the driving back board through the sealant. A soldering process is performed, so that the plurality of light-emitting elements are bonded with the plurality of pad sets.

An electronic device according to an embodiment of the disclosure includes a temporary storage base, an adhesive layer, a plurality of light-emitting elements, and a sealant. The adhesive layer is disposed on the temporary storage base. The plurality of light-emitting elements are disposed on the adhesive layer. The sealant is disposed on the temporary storage base and surrounds the adhesive layer.

An electronic device according to another embodiment of the disclosure includes a base, a driving wiring layer, and a sealant. The driving wiring layer is disposed on the base and has a plurality of pad sets. The sealant is disposed on the base and surrounds the plurality of pad sets.

DESCRIPTION OF THE EMBODIMENTS

Figure 1A:
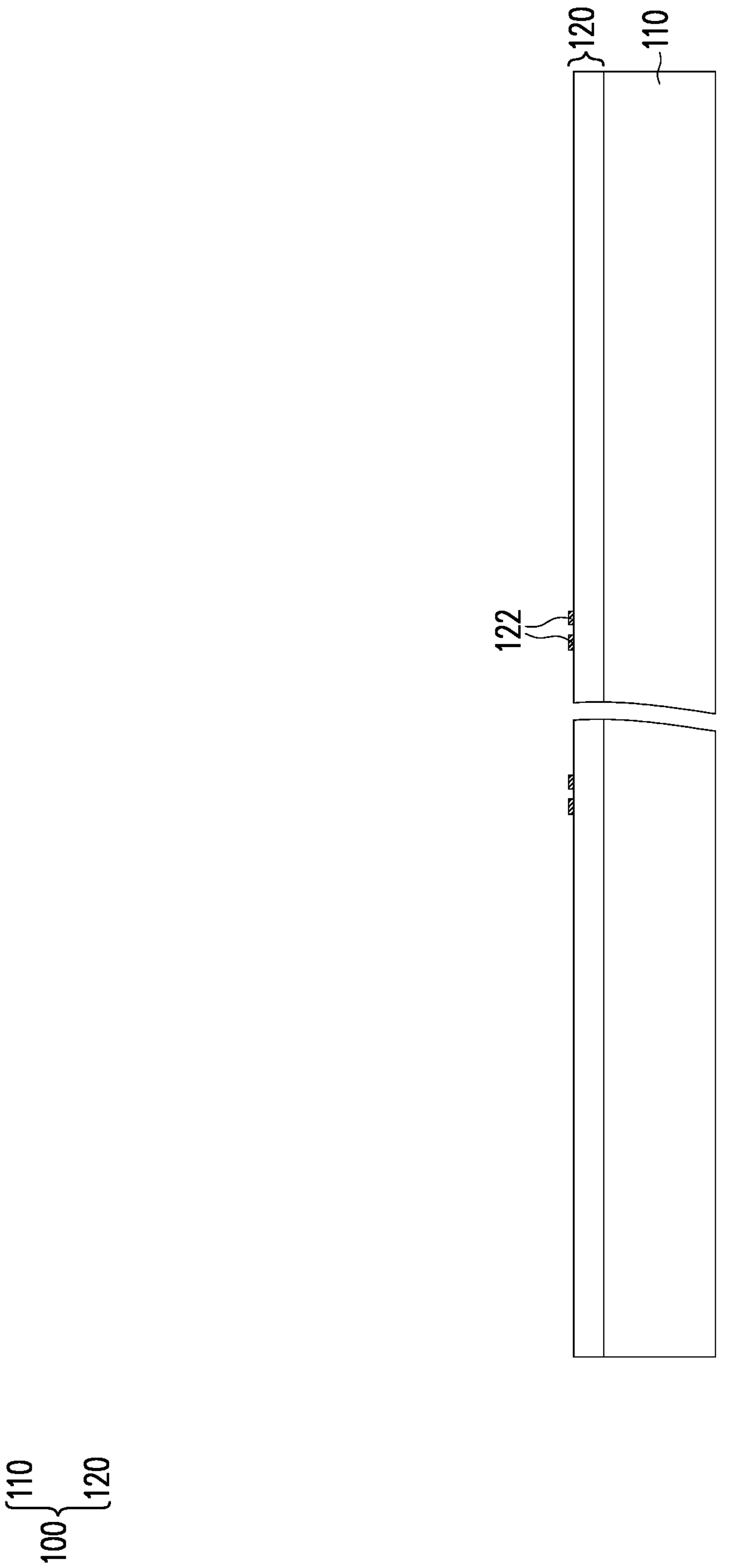
FIG. 1A to FIG. 1G are schematic cross-sectional views of a flow of a manufacturing method of an electronic device according to an embodiment of the disclosure.

Reference will now be made in detail to the exemplary embodiments of the disclosure, examples of which are illustrated in the accompanying drawings. Wherever possible, the same reference numerals are used in the drawings and descriptions to refer to the same or like parts.

It should be understood that when an element such as a layer, a film, an area, or a base is referred to as being “on” or “connected to” another element, it may be directly on or connected to the other element, or an intermediate element may also exist. Conversely, when an element is referred to as being “directly on” or “directly connected to” another element, the intermediate element does not exist. As used herein, “connected” may refer to physical and/or electrical connection. Furthermore, “electrically connected” or “coupled” may mean that other elements exist between two elements.

As used herein, "about," "approximately," or "substantially" includes stated values and averages within acceptable deviations from a particular value as determined by a person of ordinary skill in the art, taking into account the measurements in question and the specific amount of measurement-related error (i.e., the limit of the measurement system). For example, "about" may mean within one or more standard deviations of the stated value, or within ±30%, ±20%, ±10%, ±5%. Moreover, "about", "approximately" or "substantially" used herein may select an acceptable deviation range or standard deviation according to optical properties, etching properties, or other properties, and may not use one standard deviation to apply to all properties.

Unless otherwise defined, all terms (including technical and scientific terms) used herein have the same meaning as commonly understood by a person of ordinary skill in the art to which this disclosure belongs. It will be further understood that terms such as those defined in commonly used dictionaries should be interpreted to have meanings consistent with their meanings in the context of the relevant art and the disclosure, and will not be interpreted in an idealized or overly formal manner, unless specifically defined herein.

FIG. 1A to FIG. 1G are schematic cross-sectional views of a flow of a manufacturing method of an electronic device according to an embodiment of the disclosure.

Figure 1B:
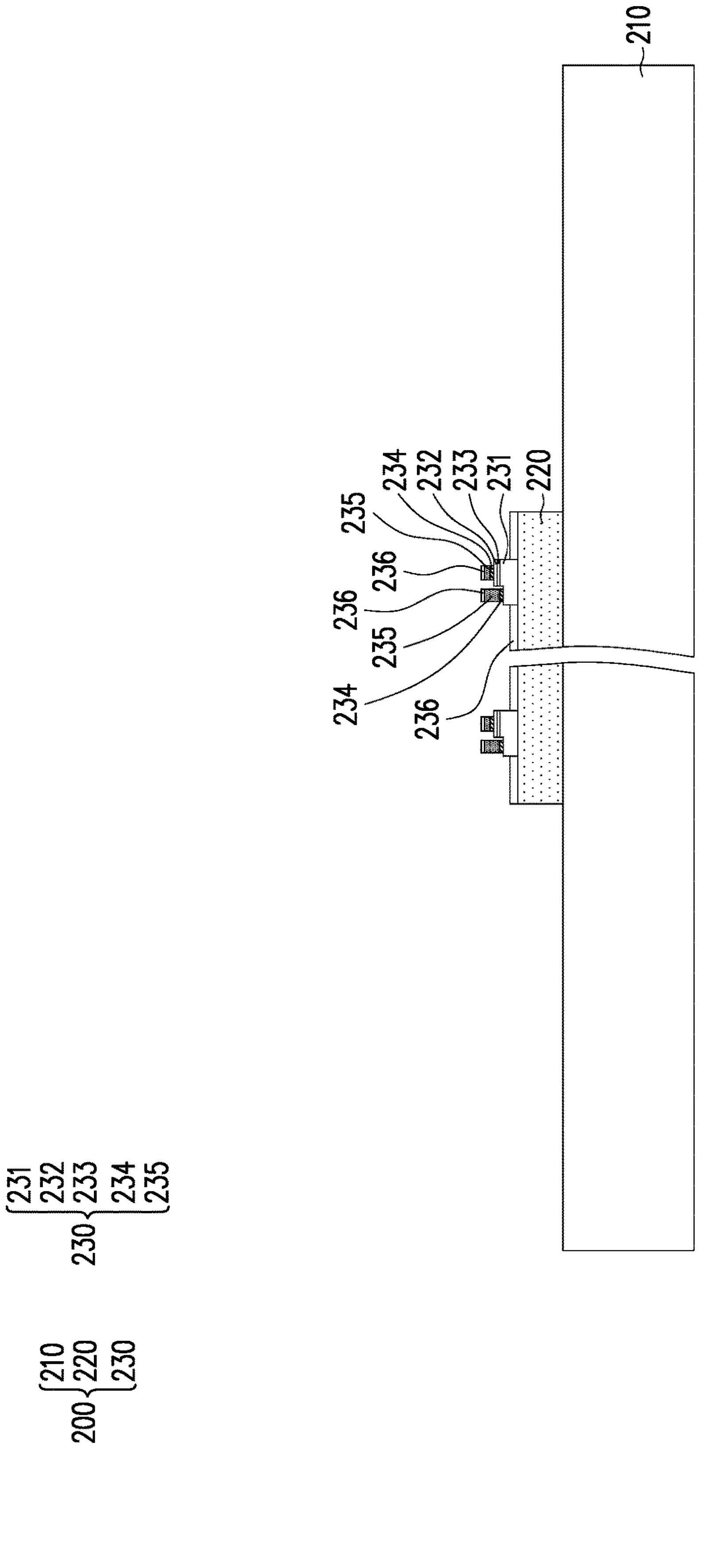

Please refer to FIG. 1A and FIG. 1B. Firstly, a driving back board 100 and a light-emitting element array base 200 are provided.

Please refer to FIG. 1A. The driving back board 100 includes a plurality of pad sets 122. In detail, the driving back board 100 includes a base 110 and a driving wiring layer 120 disposed on the base 110, in which the driving wiring layer 120 has the plurality of pad sets 122. In this embodiment, the driving wiring layer 120 further includes a plurality of pixel driving circuits (not shown) electrically connected to the plurality of pad sets 122 respectively. For example, in this embodiment, each pixel driving circuit may include a data line (not shown), a scan line (not shown), a power line (not shown), a common line (not shown), a first transistor (not shown), a second transistor (not shown), and a capacitor (not shown), in which a first terminal of the first transistor is electrically connected to the data line, a control terminal of the first transistor is electrically connected to the scan line, a second terminal of the first transistor is electrically connected to a control terminal of the second transistor, a first terminal of the second transistor is electrically connected to the power line, the capacitor is electrically connected to the second terminal of the first transistor and the first terminal of the second transistor, a second terminal of the second transistor is electrically connected to a pad of the corresponding pad set 122, and the common line is electrically connected to another pad of the pad set 122, but the disclosure is not limited thereto.

In this embodiment, the material of the base 110 of the driving back board 100 may be glass, quartz, organic polymer, opaque/reflective material (for example, wafer, ceramic, or other applicable materials), or other applicable materials.

Please refer to FIG. 1B. The light-emitting element array base 200 includes a temporary storage base 210, an adhesive layer 220 disposed on the temporary storage base 210, and a plurality of light-emitting elements 230 disposed on the adhesive layer 220. The adhesive layer 220 is positioned between the plurality of light-emitting elements 230 and the temporary storage base 210. In this embodiment, the material of the temporary storage base 210 may be glass, quartz, or other applicable materials, but the disclosure is not limited thereto. In this embodiment, the light-emitting element 230 is, for example, a μLED, but the disclosure is not limited thereto.

In this embodiment, each light-emitting element 230 includes a first semiconductor layer 231, a second semiconductor layer 232, an active layer 233 disposed between the first semiconductor layer 231 and the second semiconductor layer 232, and a plurality of electrodes 234 electrically connected to the first semiconductor layer 231 and the second semiconductor layer 232 respectively. In this embodiment, the active layer 233 of each light-emitting element 230 is positioned between the temporary storage base 210 and the plurality of electrodes 234 of the light-emitting element 230. That is to say, the plurality of electrodes 234 of the light-emitting element 230 face outward.

In this embodiment, each light-emitting element 230 may also optionally include a plurality of solders 235 disposed on the plurality of electrodes 234 respectively. For example, in this embodiment, the material of the solder 235 may include Sn, but the disclosure is not limited thereto.

Referring to FIG. 1B, in this embodiment, next, a solder flux layer 236 may be optionally formed on the solder 235 to help the light-emitting element 230 bond with the pad set 122 of the driving back board 100 in a subsequent process.

Figure 1C:
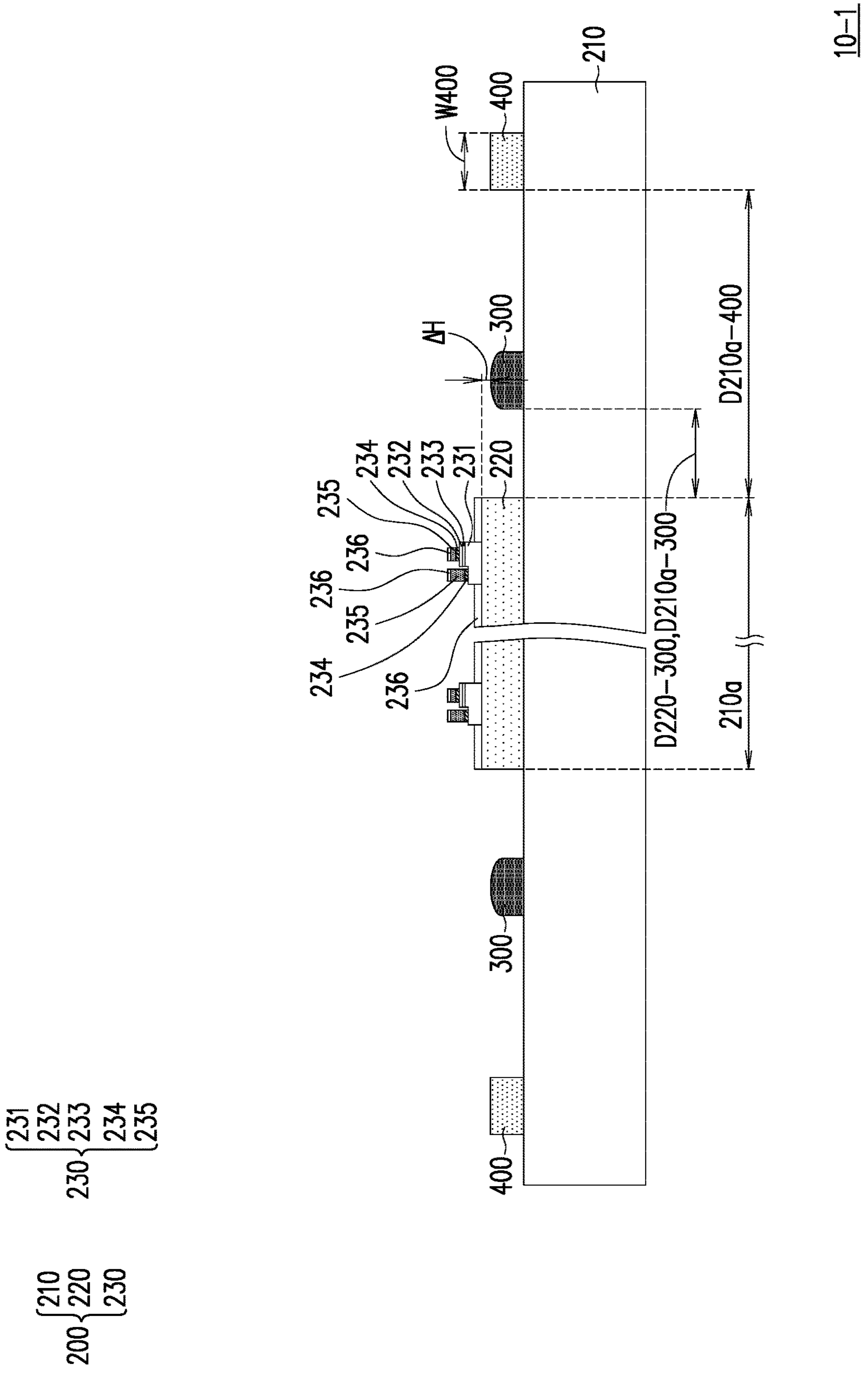

Please refer to FIG. 1A, FIG. 1B, and FIG. 1C. Next, a sealant 400 is formed on one of the driving back board 100 and the light-emitting element array base 200, in which the sealant 400 surrounds one of the plurality of pad sets 122 and the adhesive layer 220. In this embodiment, an auxiliary element 300 may also be formed on one of the driving back board 100 and the light-emitting element array base 200, in which the auxiliary element 300 surrounds one of the plurality of pad sets 122 and the adhesive layer 220.

Please refer to FIG. 1C. For example, in this embodiment, the sealant 400 and the auxiliary element 300 may be optionally formed on the temporary storage base 210 of the light-emitting element array base 200. In detail, in this embodiment, the auxiliary element 300 may be formed on the temporary storage base 210 first, in which the auxiliary element 300 may be formed by curing an adhesive material, the auxiliary element 300 is disposed on the temporary storage base 210 and surrounds the adhesive layer 220, and the auxiliary element 300 and the adhesive layer 220 are separated by a distance D220-300. Afterward, the sealant 400 is formed on the temporary storage base 210, in which the sealant 400 surrounds the adhesive layer 220, and the auxiliary element 300 is positioned between the adhesive layer 220 and at least a portion of the sealant 400. In this embodiment, the sealant 400 is, for example, a UV-curable adhesive, and the sealant 400 is not cured but remains adhesive.

It should be noted that, the disclosure does not limit that both the sealant 400 and the auxiliary element 300 have to be formed on the light-emitting element array base 200, any one of the sealant 400 and the auxiliary element 300 may be formed on either one of the driving back board 100 and the light-emitting element array base 200.

An electronic device 10-1 may include the temporary storage base 210, the adhesive layer 220, the plurality of light-emitting elements 230, the sealant 400, and the auxiliary element 300. In this embodiment, the number of turns of the sealant 400 may be optionally set to 1, a glue width W400 of the sealant 400 may be greater than or equal to 3000 μm, the plurality of light-emitting elements 230 are disposed in a work area 210*a* of the temporary storage base 210, and a distance D210*a*-400 from the sealant 400 to the work area 210*a* is greater than or equal to 7000 μm.

However, the disclosure is not limited thereto. In other embodiments, the number of turns of the sealant 400, the glue width W400 of the sealant 400, and the distance D210*a*-400 from the sealant 400 to the work area 210*a* may be designed in other proper manners according to actual needs.

In this embodiment, the number of turns of the auxiliary element 300 may optionally set to 1, a height difference ΔH between the auxiliary element 300 and the adhesive layer 220 may be less than 40 μm, and a distance D210*a*-300 from the auxiliary element 300 to the work area 210*a* is greater than 15 mm. However, the disclosure is not limited thereto. In other embodiments, the number of turns of the auxiliary element 300, the height difference ΔH between the auxiliary element 300 and the adhesive layer 220, and the distance D210*a*-300 from the auxiliary element 300 to the work area 210*a* may all be changed to other proper manners according to the actual needs.

Figure 1D:
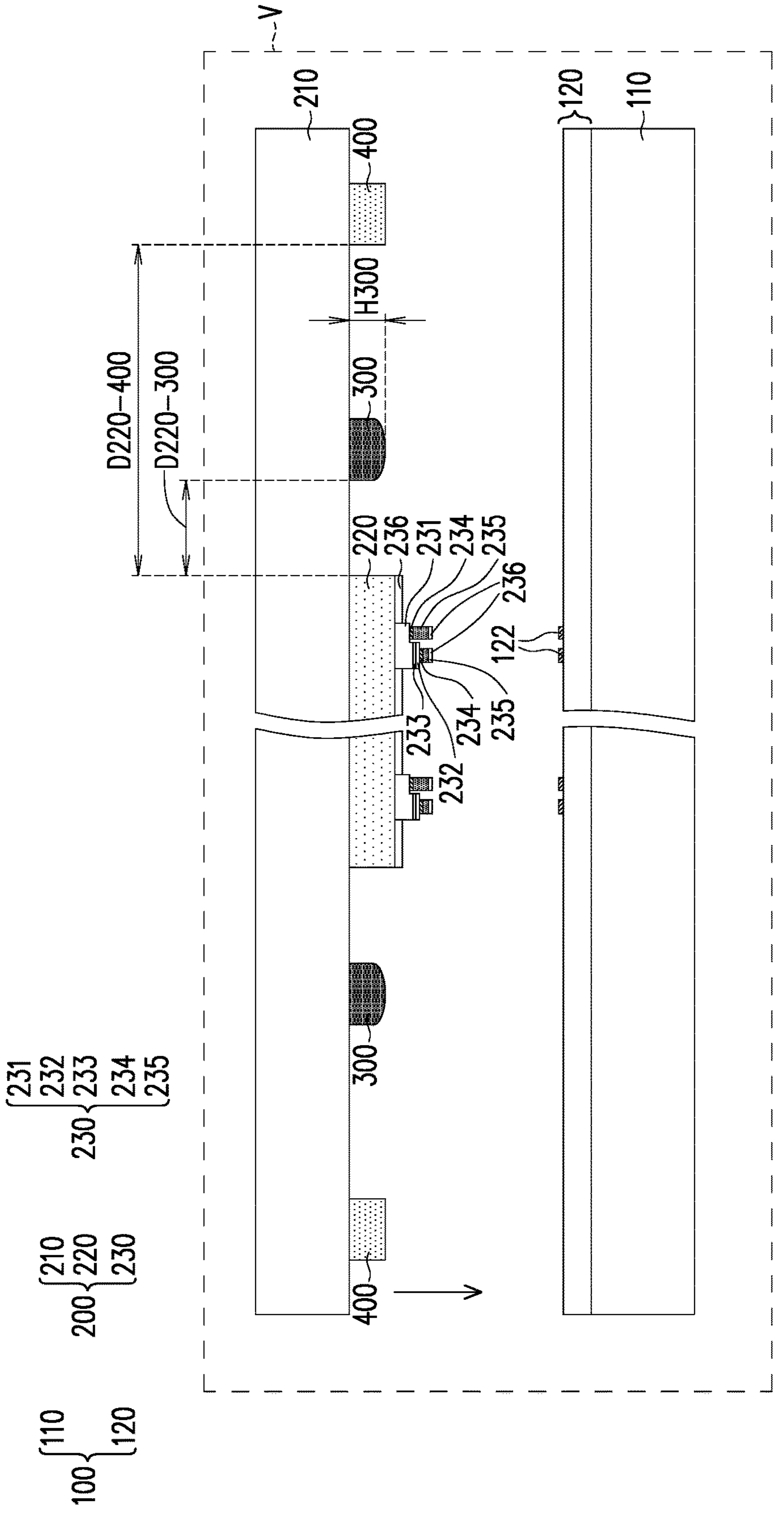
Figure 1E:
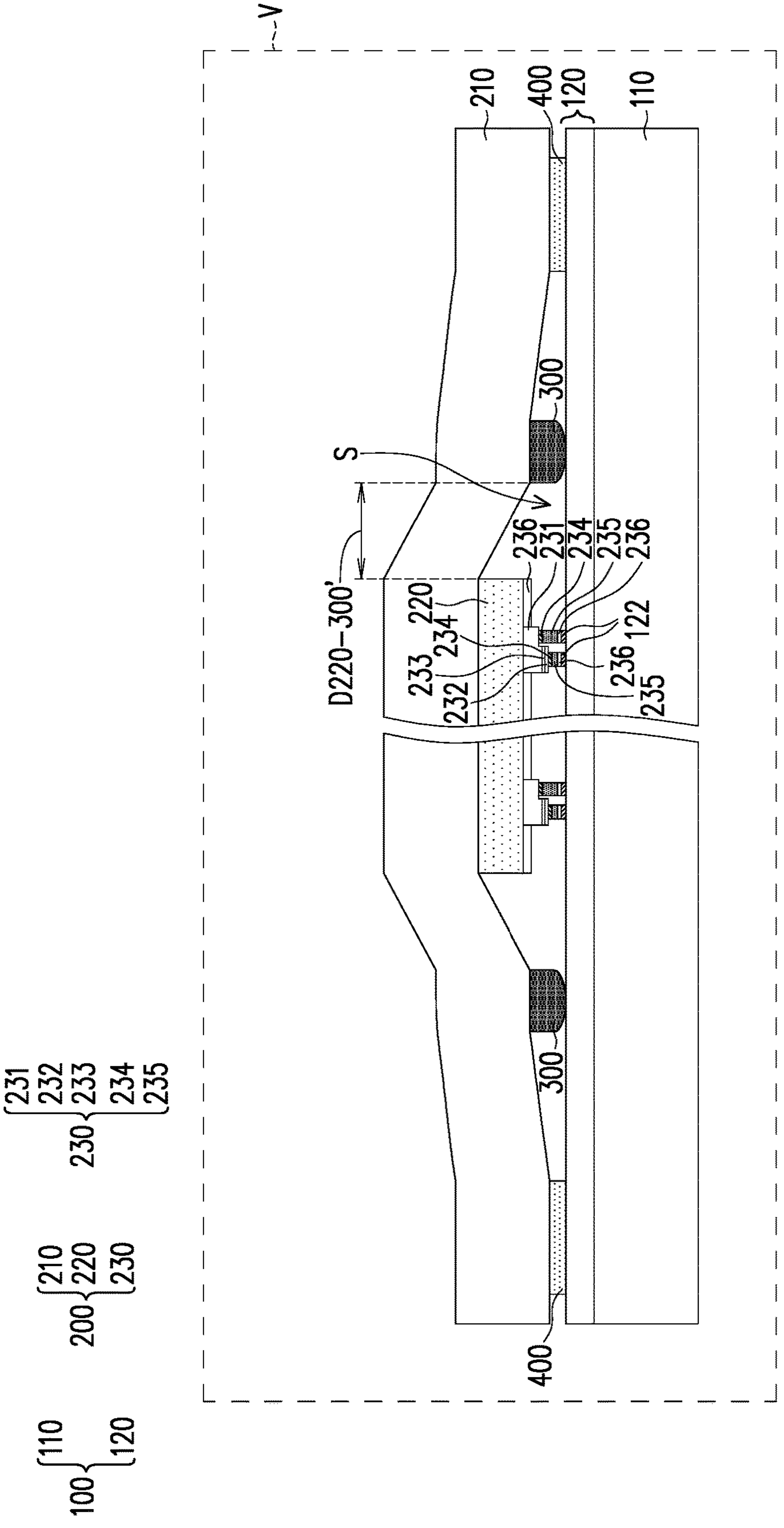

Please refer to FIG. 1D and FIG. 1E. Next, the light-emitting element array base 200 and the driving back board 100 are aligned and pressed together in a near-vacuum environment (for example, in a chamber V that may be evacuated), so that the plurality of light-emitting elements 230 are aligned with the plurality of pad sets 122, and the light-emitting element array base 200 is connected with the driving back board 100 through the sealant 400. After the light-emitting element array base 200 is connected with the driving back board 100 through the sealant 400, the light-emitting element array base 200, the driving back board 100, and the sealant 400 surround and form a space S. Since the light-emitting element array base 200 and the driving back board 100 are pressed together in a near-vacuum environment, under a condition that the light-emitting element array base 200, the driving back board 100, and the sealant 400 are connected normally, the space S is in a near-vacuum state.

For example, in this embodiment, the bottom pressure of the chamber V that may be evacuated may be less than 10000 Pa, and the downward pressure of the light-emitting element array base 200 on the driving back board 100 may be greater than $1.5 N/cm^2$, but the disclosure is not limited thereto.

Figure 2:
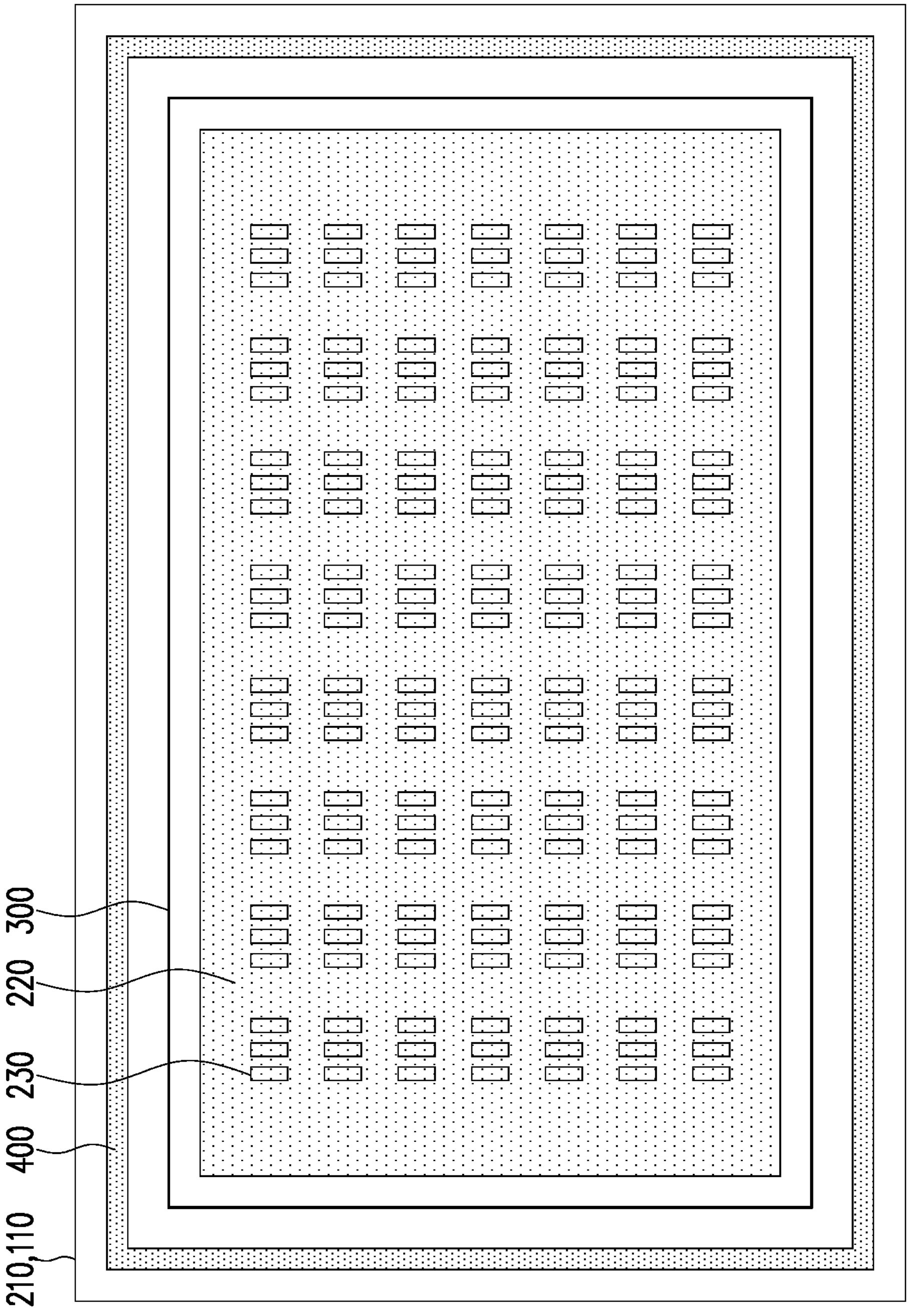
FIG. 2 is a schematic top view of a light-emitting element, an adhesive layer, an auxiliary element, a sealant, a temporary storage base, and a base according to an embodiment of the disclosure.

FIG. 2 is a schematic top view of a light-emitting element, an adhesive layer, an auxiliary element, a sealant, a temporary storage base, and a base according to an embodiment of the disclosure. Please refer to FIG. 1E and FIG. 2. The auxiliary element 300 is disposed on one of the driving back board 100 and the light-emitting element array base 200. After the light-emitting element array base 200 and the driving back board 100 are pressed together, the auxiliary element 300 is separated from the adhesive layer 220 by a distance D220-300', the auxiliary element 300 is positioned between the adhesive layer 220 and at least a portion of the sealant 400, and the auxiliary element 300 abuts against the other of the driving back board 100 and the light-emitting element array base 200. For example, in this embodiment, the auxiliary element 300 is disposed on the light-emitting element array base 200, and after the light-emitting element array base 200 and the driving back board 100 are pressed together, the auxiliary element 300 abuts against the driving back board 100, but the disclosure is not limited thereto.

Please refer to FIG. 1E. It is worth mentioning that, in this embodiment, when the light-emitting element array base 200 and the driving back board 100 are pressed together, the disposition of the auxiliary element 300 may make the driving back board 100 less likely to be overly warped near the edge of the adhesive layer 220, so that the light-emitting element 230 disposed near the edge of the adhesive layer 220 and the pad set 122 of the driving back board 100 may be aligned and pressed together smoothly. Please refer to FIG. 1D and FIG. 1E. For example, in this embodiment, a distance D220-400 between the adhesive layer 220 and the sealant 400 is approximately 16 mm, and a height H300 of the auxiliary element 300 is approximately 88 μm. The disposition of the auxiliary element 300 may also improve the Newton ring problem from interior after the light-emitting element array base 200 and the driving back board 100 are pressed together.

Figure 1F:
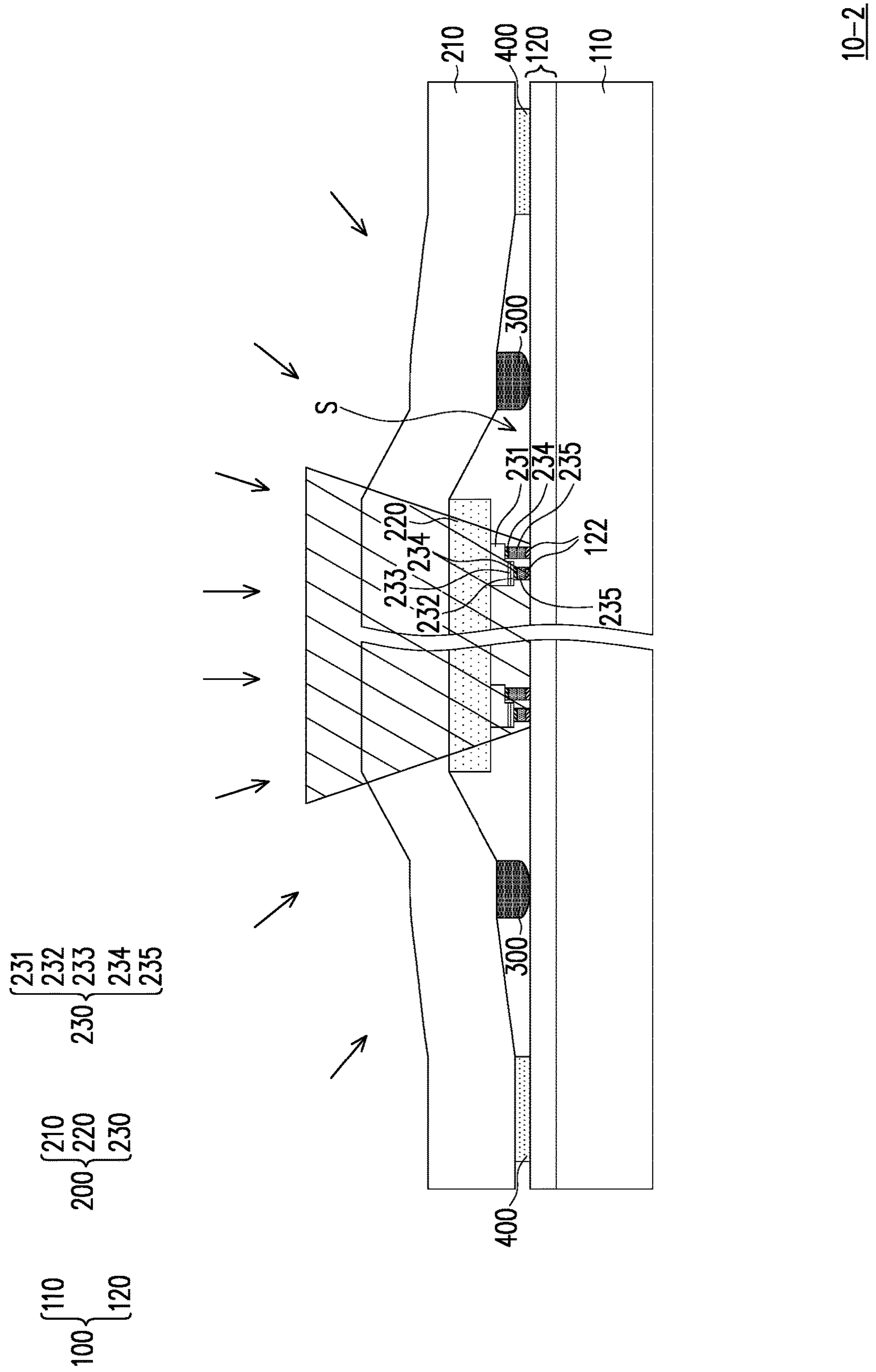
Figure 1G:
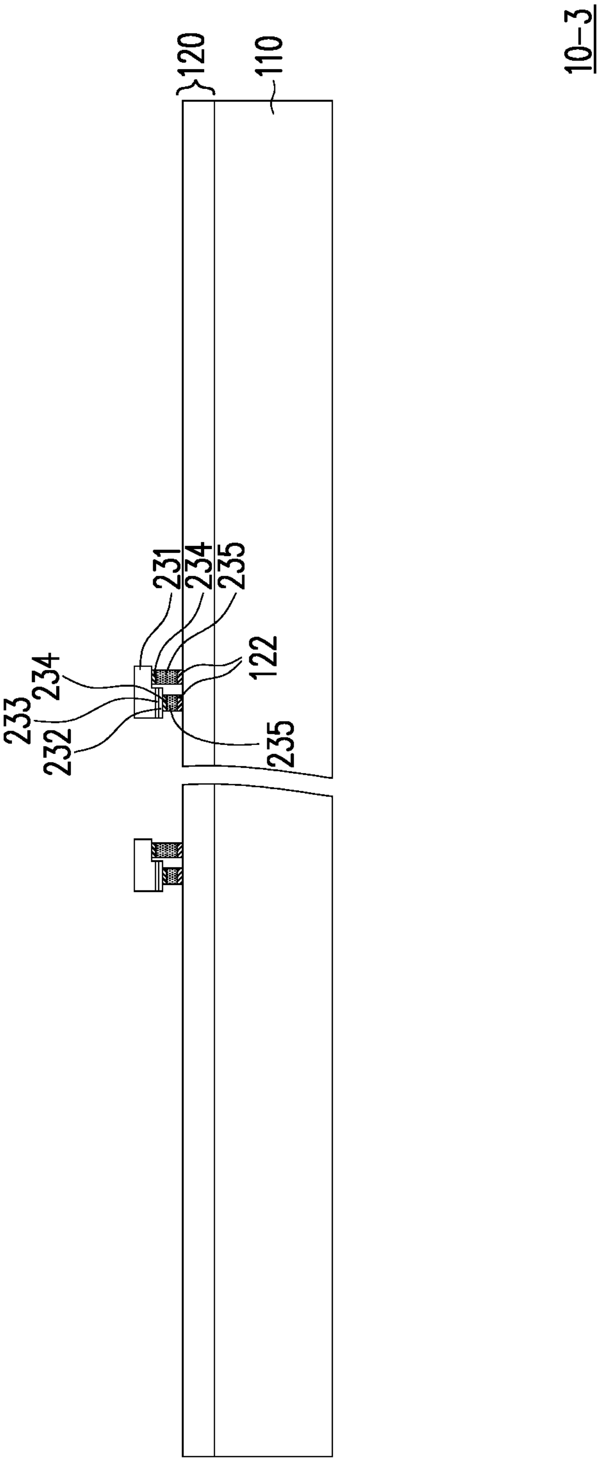

Please refer to FIG. 1F. Next, a soldering process is performed, so that the plurality of light-emitting elements 230 are bonded with the plurality of pad sets 122. After the plurality of light-emitting elements 230 are bonded with the plurality of pad sets 122, the plurality of light-emitting elements 230 are electrically connected with the plurality of pad sets 122 respectively. For example, in this embodiment, the light-emitting element 230 may be bonded with the pad set 122 optionally by using a laser soldering process, but the disclosure is not limited thereto.

Please refer to FIG. 1E and FIG. 1F. It is worth noting that, in this embodiment, after the light-emitting element array base 200 is connected with the driving back board 100 through the sealant 400, the light-emitting element array base 200, the driving back board 100, and the sealant 400 surround and form the space S, the space S is in the near-vacuum state, and the soldering process is performed while maintaining the near-vacuum state of the space S. Since the space S is in the near-vacuum state, during the soldering process, naturally, the atmospheric pressure exerts pressure on the light-emitting element array base 200 from multiple directions, so that the plurality of light-emitting elements 230 of the light-emitting element array base 200 may be evenly pressed on the plurality of pad sets 122 of the driving back board 100. In this way, the yield of bonding the plurality of light-emitting elements 230 with the plurality of pad sets 122 may be greatly improved.

Please refer to FIG. 1F and FIG. 2. An electronic device 10-2 includes the temporary storage base 210, the adhesive layer 220, the plurality of light-emitting elements 230, the auxiliary element 300, the sealant 400, and the driving back board 100. The driving back board 100 is disposed opposite to the temporary storage base 210. The temporary storage base 210 and the driving back board 100 are connected to each other through the sealant 400. The plurality of light-emitting elements 230 are electrically connected to the plurality of pad sets 122. The plurality of light-emitting elements 230 are disposed between the adhesive layer 220 and the driving back board 100. The adhesive layer 220 is disposed between the temporary storage base 210 and the plurality of light-emitting elements 230. The auxiliary element 300 is disposed between the temporary storage base 210 and the driving back board 100 and positioned between the adhesive layer 220 and at least a portion of the sealant 400. In this embodiment, the auxiliary element 300 may be disposed on the temporary storage base 210, surround the adhesive layer 220, and abut against the driving back board 100, but the disclosure is not limited thereto.

Please refer to FIG. 1E and FIG. 1F. After the plurality of light-emitting elements 230 are bonded with the plurality of pad sets 122, then, the temporary storage base 210 and the adhesive layer 220 may be removed from the plurality of light-emitting elements 230. In addition, the sealant 400 remaining on the driving back board 100 may also be removed, in which the sealant 400 is uncured and easy to remove. For example, in this embodiment, a blade may be used to insert the space S from outside the sealant 400, so that the near-vacuum state of the space S is broken, thereby the temporary storage base 210 and the adhesive layer 220 may be easily removed from the light-emitting element 230. Afterward, the sealant 400 remaining on the driving back board 100 is wiped off with a cloth dampened with alcohol. Here, an electronic device 10-3 of this embodiment is completed. The electronic device 10-3 in this embodiment is, for example, a LED display panel, but the disclosure is not limited thereto.

It has to be noted here that the following embodiments use the reference numerals and part of the content the same as the previous embodiments, where the same numerals are used to indicate the same or similar elements, and descriptions of the same technical content are omitted. For the description of omitted parts, reference may be made to the aforementioned embodiments, and will not be repeated in the following embodiments.

Figure 3:
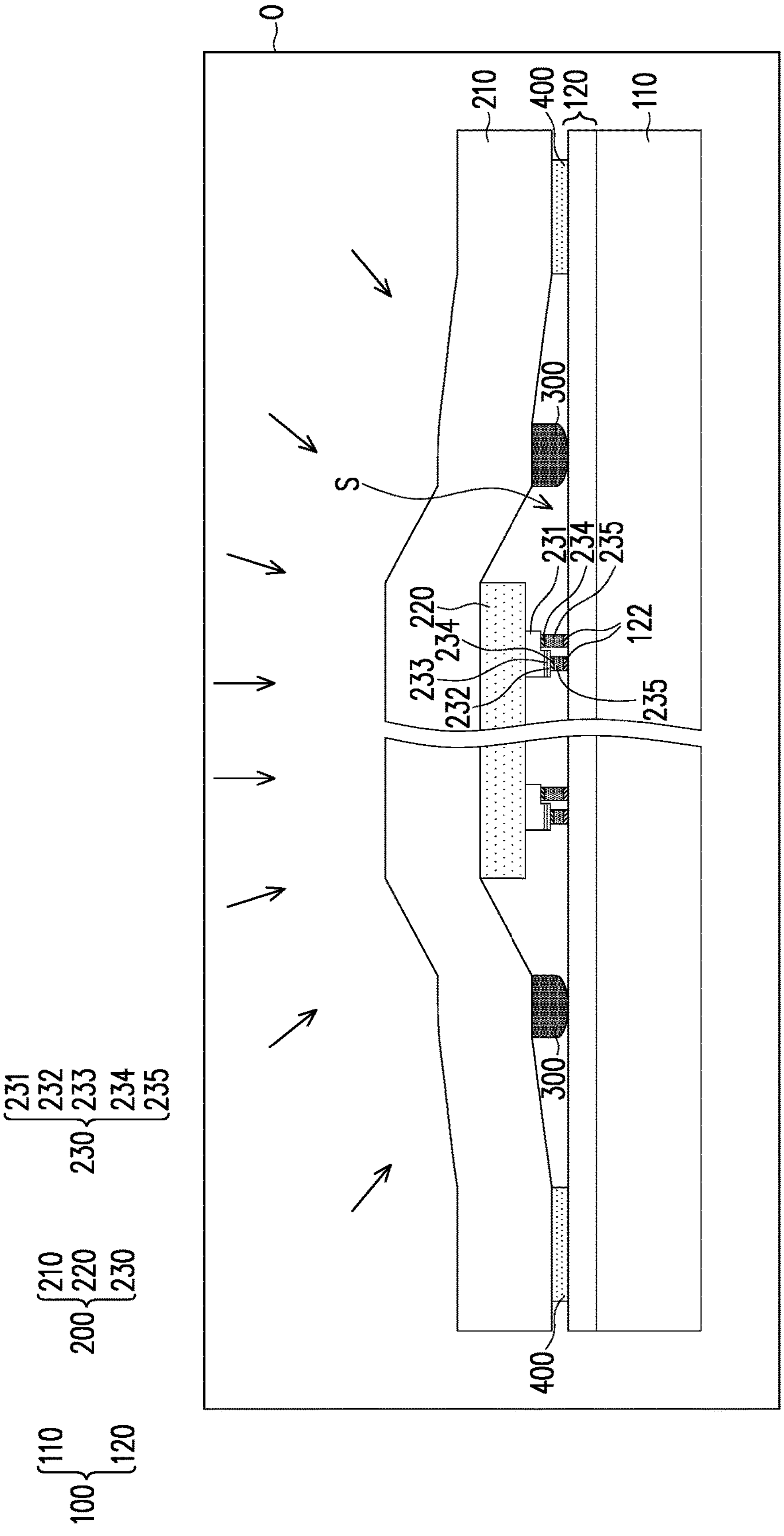
FIG. 3 is a schematic cross-sectional view of a partial flow of a manufacturing method of an electronic device according to another embodiment of the disclosure.

FIG. 3 is a schematic cross-sectional view of a partial flow of a manufacturing method of an electronic device according to another embodiment of the disclosure. In the embodiment of FIG. 3, the light-emitting element array base 200 and the driving back board 100 connected through the sealant 400 may be placed in an oven O, so that the solder 235 is heated and melted, and then the light-emitting element 230 is bonded with the pad set 122. In short, in this embodiment, the light-emitting element 230 and the pad set 122 may be bonded by using a reflow process.

Figure 4:
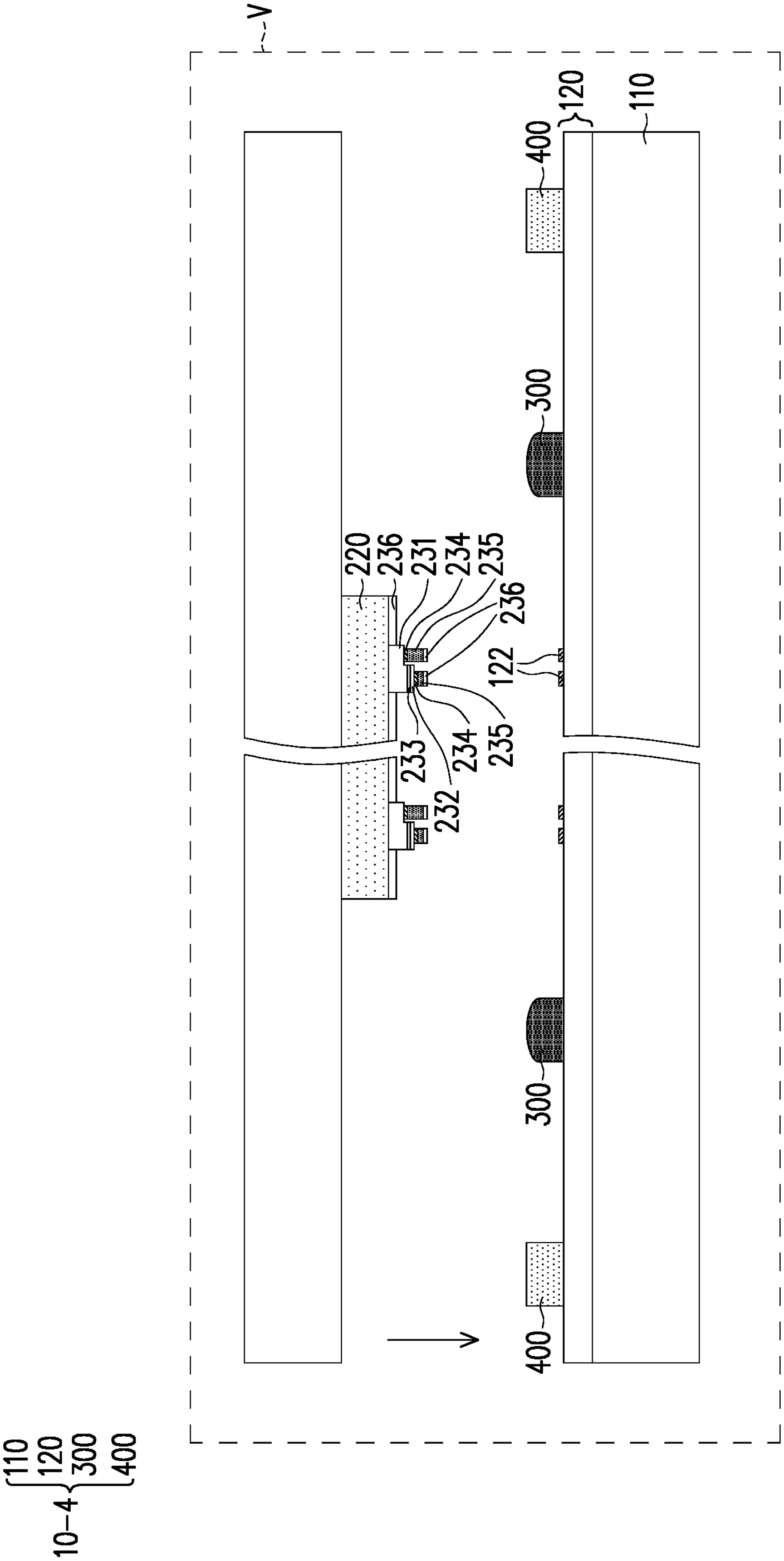
FIG. 4 is a schematic cross-sectional view of a partial flow of a manufacturing method of an electronic device according to another embodiment of the disclosure.

FIG. 4 is a schematic cross-sectional view of a partial flow of a manufacturing method of an electronic device according to another embodiment of the disclosure. In the embodiment shown in FIG. 4, the sealant 400 and the auxiliary element 300 may also be formed on the driving back board 100 first. Afterward, the light-emitting element array base 200 and the driving back board 100 are pressed together. An electronic device 10-4 includes the base 110, the driving wiring layer 120, the sealant 400, and the auxiliary element 300. The driving wiring layer 120 is disposed on the base 110 and has the plurality of pad sets 122. The sealant 400 is disposed on the base 110 and surrounds the plurality of pad sets 122. The auxiliary element 300 is disposed on the base 110 and surrounds the plurality of pad sets 122. The auxiliary element 300 is positioned between the plurality of pad sets 122 and at least a portion of the sealant 400.

Figure 5:
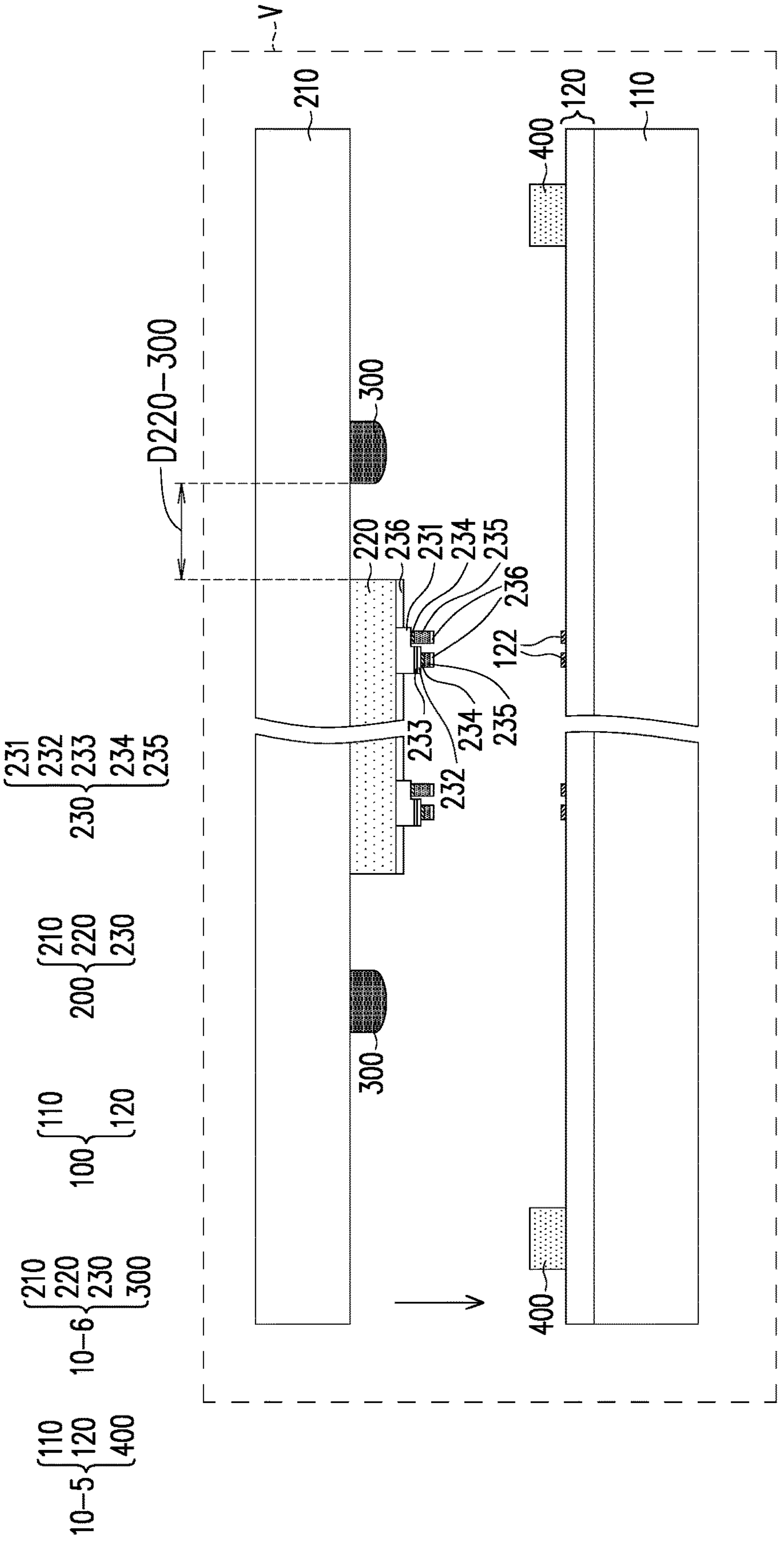
FIG. 5 is a schematic cross-sectional view of a partial flow of a manufacturing method of an electronic device according to still another embodiment of the disclosure.

FIG. 5 is a schematic cross-sectional view of a partial flow of a manufacturing method of an electronic device according to still another embodiment of the disclosure. In the embodiment shown in FIG. 5, the sealant 400 and the auxiliary element 300 may be formed on the driving back board 100 and the light-emitting element array base 200 respectively. Afterward, the light-emitting element array base 200 and the driving back board 100 are pressed together. An electronic device 10-5 includes the base 110, the driving wiring layer 120, and the sealant 400. The driving wiring layer 120 is disposed on the base 110 and has the plurality of pad sets 122. The sealant 400 is disposed on the base 110 and surrounds the plurality of pad sets 122. An electronic device 10-6 includes the temporary storage base 210, the adhesive layer 220, the plurality of light-emitting elements 230, and the auxiliary element 300. The auxiliary element 300 surrounds the adhesive layer 220 and is separated from the adhesive layer 220 by the distance D220-300.

Figure 6:
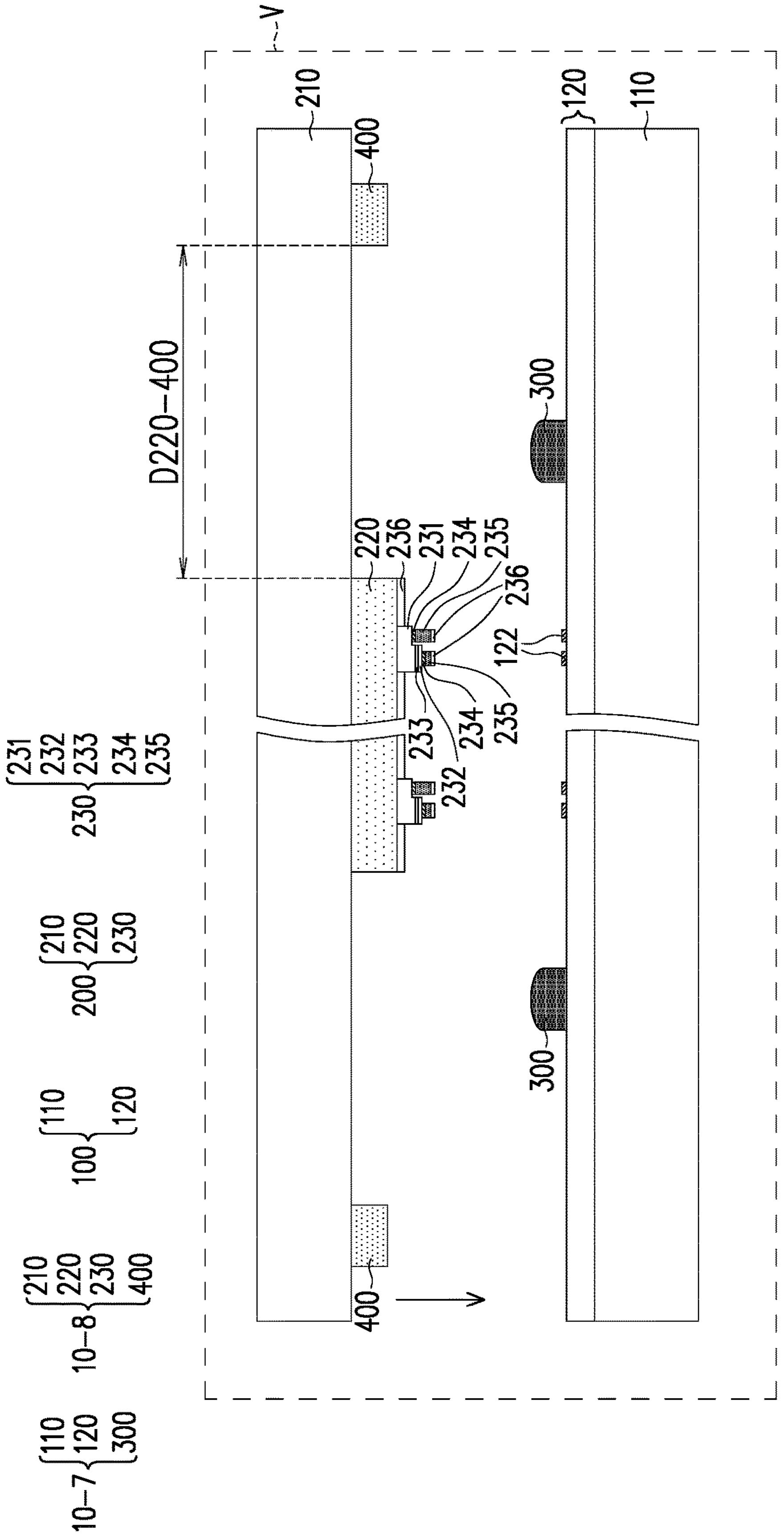
FIG. 6 is a schematic cross-sectional view of a partial flow of a manufacturing method of an electronic device according to an embodiment of the disclosure.

FIG. 6 is a schematic cross-sectional view of a partial flow of a manufacturing method of an electronic device according to an embodiment of the disclosure. In the embodiment shown in FIG. 6, the auxiliary element 300 and the sealant 400 may be formed on the driving back board 100 and the light-emitting element array base 200 respectively. Afterward, the light-emitting element array base 200 and the driving back board 100 are pressed together. An electronic device 10-7 includes the base 110, the driving wiring layer 120, and the auxiliary element 300. The driving wiring layer 120 is disposed on the base 110 and has the plurality of pad sets 122. The auxiliary element 300 surrounds the plurality of pad sets 122. An electronic device 10-8 includes the temporary storage base 210, the adhesive layer 220, the plurality of light-emitting elements 230, and the sealant 400. The sealant 400 surrounds the adhesive layer 220 and is separated from the adhesive layer 220 by the distance D220-400.

Figure 7:
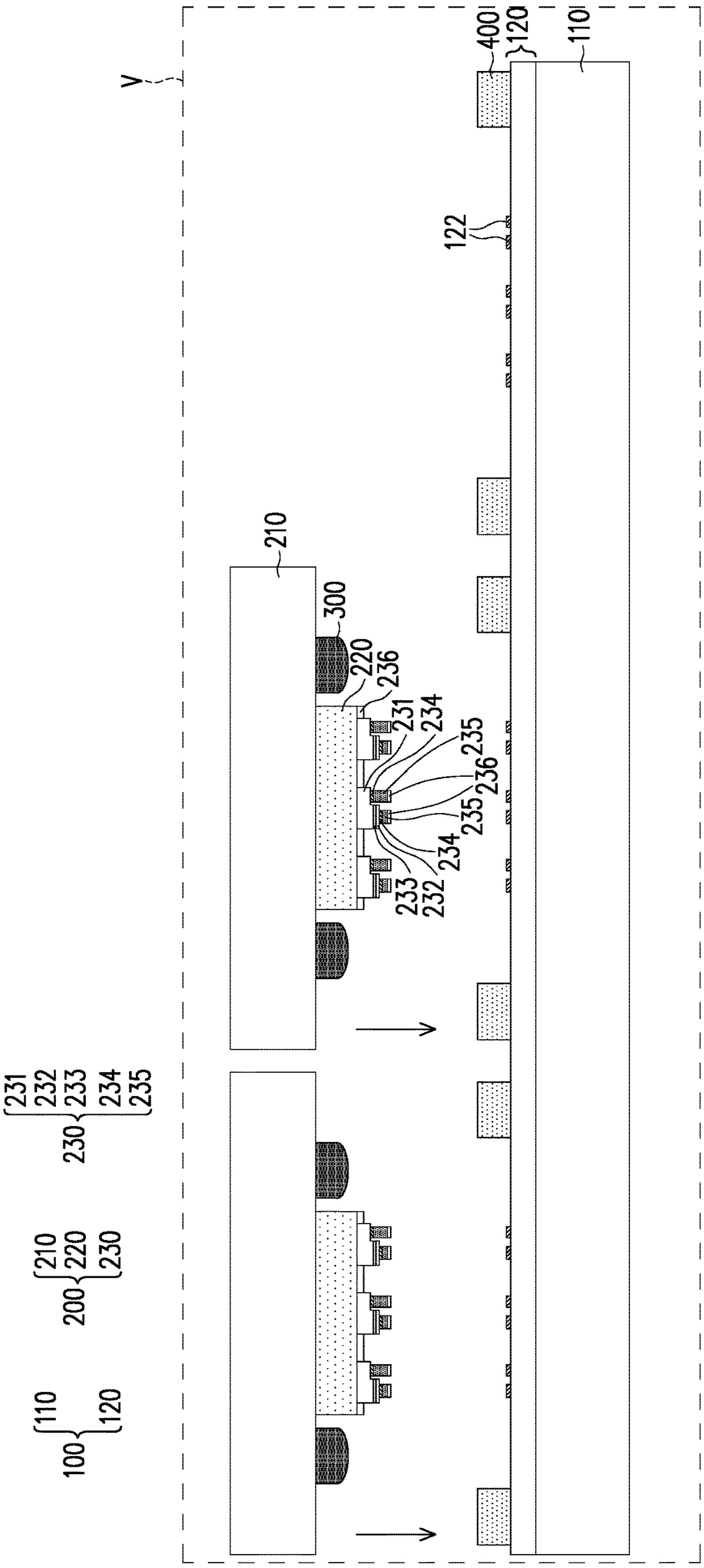
FIG. 7 is a schematic cross-sectional view of a partial flow of a manufacturing method of an electronic device according to another embodiment of the disclosure.
Figure 8:
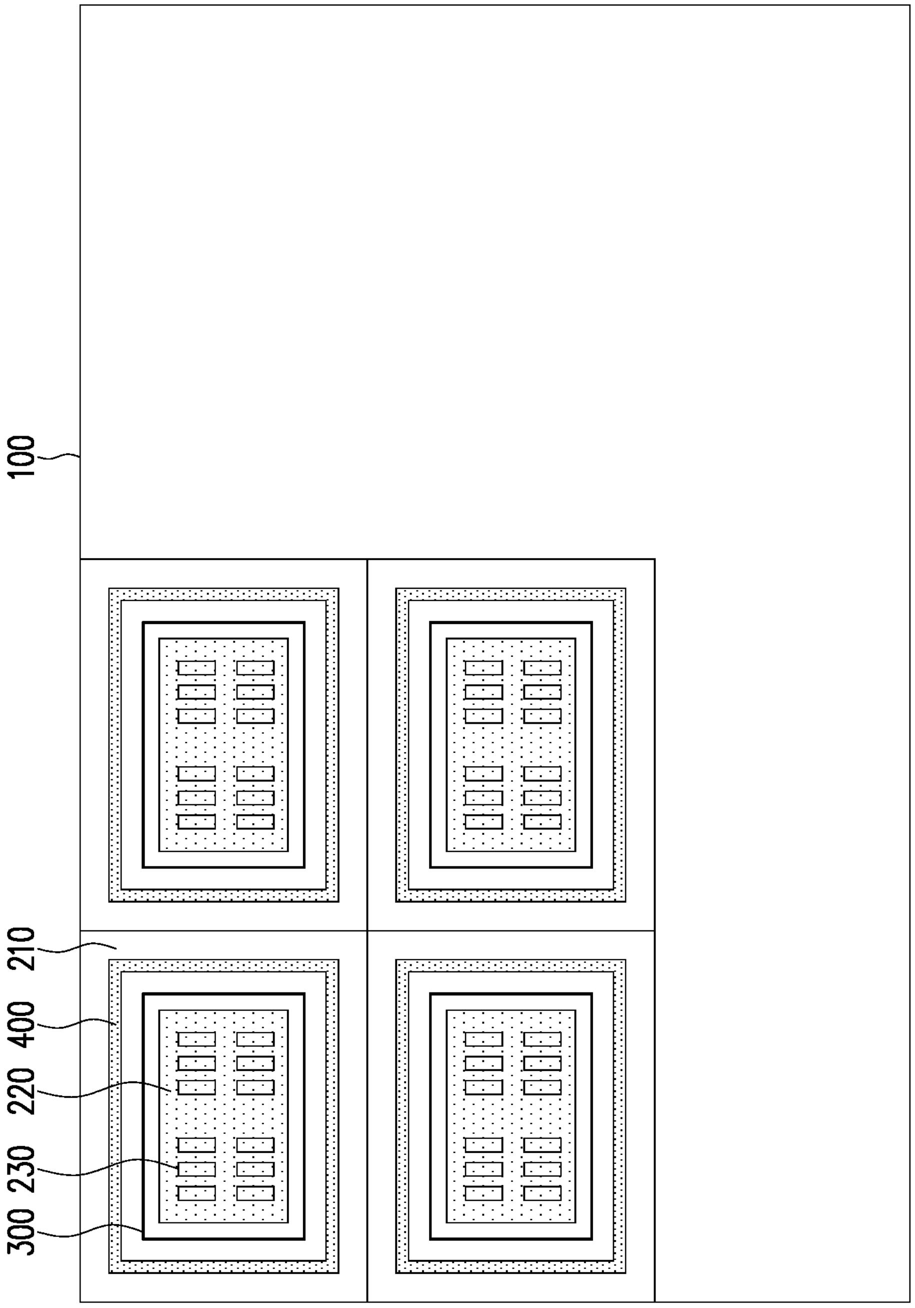
FIG. 8 is a schematic top view of a partial flow of a manufacturing method of an electronic device according to another embodiment of the disclosure.

FIG. 7 is a schematic cross-sectional view of a partial flow of a manufacturing method of an electronic device according to another embodiment of the disclosure. FIG. 8 is a schematic top view of a partial flow of a manufacturing method of an electronic device according to another embodiment of the disclosure. The embodiment of FIG. 7 and FIG. 8 is similar to the embodiment of FIG. 1D and FIG. 2, the difference between the two is that, in the embodiment of FIG. 1D and FIG. 2, it is one light-emitting element array base 200 pressed together with the driving back board 100; but in the embodiment shown in FIG. 7 and FIG. 8, it is a plurality of light-emitting element array bases 200 pressed together with the driving back board 100.

What is claimed is:

1. A manufacturing method of an electronic device, comprising:

providing a driving back board and a light-emitting element array base, wherein the driving back board comprises a plurality of pad sets, and the light-emitting element array base comprises a temporary storage base, an adhesive layer disposed on the temporary storage base, and a plurality of light-emitting elements disposed on the adhesive layer;

forming a sealant on one of the driving back board and the light-emitting element array base;

forming an auxiliary element on one of the driving back board and the light-emitting element array base, wherein the auxiliary element is formed in a closed-ring configuration;

making the light-emitting element array base and the driving back board aligned and pressed together in a near-vacuum environment, so that the light-emitting elements are aligned with the pad sets, the light-emitting element array base is connected with the driving back board through the sealant, the sealant is disposed on the temporary storage base and surrounds the adhesive layer, and the auxiliary element is disposed on the temporary storage base between the adhesive layer and at least a portion of the sealant; and performing a soldering process, so that the light-emitting elements are bonded with the pad sets.

2. The manufacturing method of the electronic device as claimed in claim 1, wherein after the light-emitting element array base is connected with the driving back board through the sealant, the light-emitting element array base, the driving back board, and the sealant surround and form a space, the space is in a near-vacuum state, and the soldering process is performed while maintaining the near-vacuum state of the space.

3. The manufacturing method of the electronic device as claimed in claim 1, wherein the auxiliary element surrounds the adhesive layer.

4. The manufacturing method of the electronic device as claimed in claim 1, wherein after the light-emitting element array base and the driving back board are pressed together, the auxiliary element abuts against the driving back board.

5. The manufacturing method of the electronic device as claimed in claim 1, wherein the auxiliary element is separated from the adhesive layer by a distance.

6. The manufacturing method of the electronic device as claimed in claim 1 further comprises:

removing the temporary storage base and the adhesive layer from the light-emitting elements after the light-emitting elements are bonded with the pad sets and removing the sealant remaining on the driving back board.

7. An electronic device, comprising:

a temporary storage base;

an adhesive layer disposed on the temporary storage base;

a plurality of light-emitting elements disposed on the adhesive layer;

a sealant disposed on the temporary storage base and surrounding the adhesive layer; and an auxiliary element disposed on the temporary storage base between the adhesive layer and at least a portion of the sealant, wherein the auxiliary element is formed in a closed-ring configuration.

8. The electronic device as claimed in claim 7, wherein the auxiliary element is separated from the adhesive layer by a distance.

9. The electronic device as claimed in claim 7, further comprising:

a driving back board having a plurality of pad sets disposed opposite to the temporary storage base, wherein the temporary storage base and the driving back board are connected to each other through the sealant, the light-emitting elements are electrically connected to the pad sets, the light-emitting elements are disposed between the adhesive layer and the driving back board, and the adhesive layer is disposed between the temporary storage base and the light-emitting elements.

10. The electronic device as claimed in claim 9, wherein the auxiliary element is disposed between the temporary storage base and the driving back board.

11. The electronic device as claimed in claim 10, wherein the auxiliary element is disposed on one of the temporary storage base and the driving back board, the auxiliary element surrounds one of the adhesive layer and the pad sets, and the auxiliary element abuts against the other of the temporary storage base and the driving back board.

12. The electronic device as claimed in claim 10, wherein the auxiliary element is separated from the adhesive layer by a distance.

13. An electronic device, comprising:

a base;

a driving wiring layer disposed on the base and having a plurality of pad sets;

a sealant disposed on the base and surrounding the pad sets; and an auxiliary element disposed on the base and surrounding the pad sets, wherein the auxiliary element is formed in a closed-ring configuration.

14. The electronic device as claimed in claim 13, wherein the auxiliary element is positioned between the pad sets and at least a portion of the sealant.

* * * * *